(12) United States Patent
Kuzawinski et al.

(10) Patent No.: US 6,882,038 B2
(45) Date of Patent: Apr. 19, 2005

(54) PLATING TAIL DESIGN FOR IC PACKAGES

(75) Inventors: Mark J. Kuzawinski, Maine, NY (US); Edward M. Wolf, St. Albans, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/253,677

(22) Filed: Sep. 24, 2002

(65) Prior Publication Data

US 2004/0104464 A1 Jun. 3, 2004

(51) Int. Cl.[7] .............................................. H01L 23/52
(52) U.S. Cl. ..................... 257/691; 257/691; 257/774
(58) Field of Search .................................. 257/691, 774

(56) References Cited

U.S. PATENT DOCUMENTS

| 4,581,301 A | 4/1986 | Michaelson |
| 2003/0141107 A1 * | 7/2003 | Burton ....................... 174/261 |

* cited by examiner

Primary Examiner—Roy K. Potter
(74) Attorney, Agent, or Firm—Schmmeiser, Olsen & Watts; William H. Steinberg

(57) ABSTRACT

A plating tail connected to a signal trace for use during an electroplating operation is fabricated such that it has a substantially different impedance from the signal trace at a characteristic frequency in use, so that adverse reflections during operation are reduced below a threshold of significance.

20 Claims, 2 Drawing Sheets

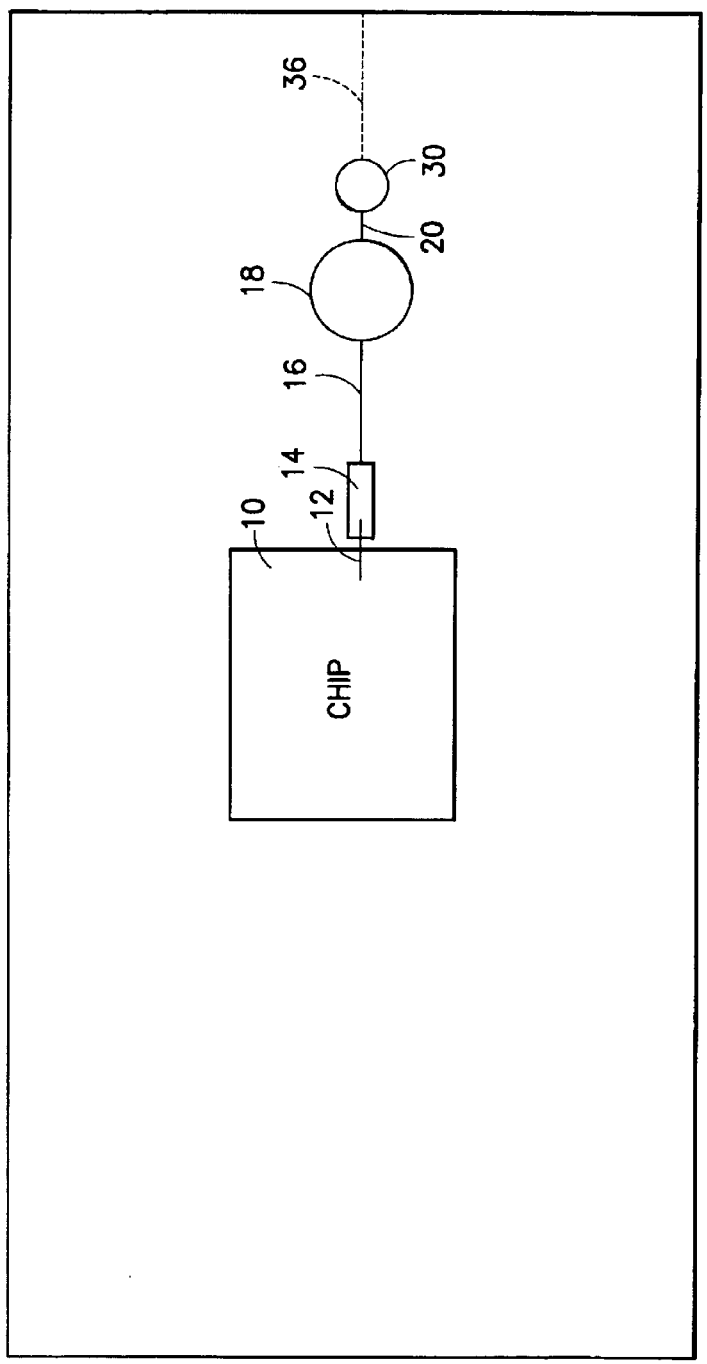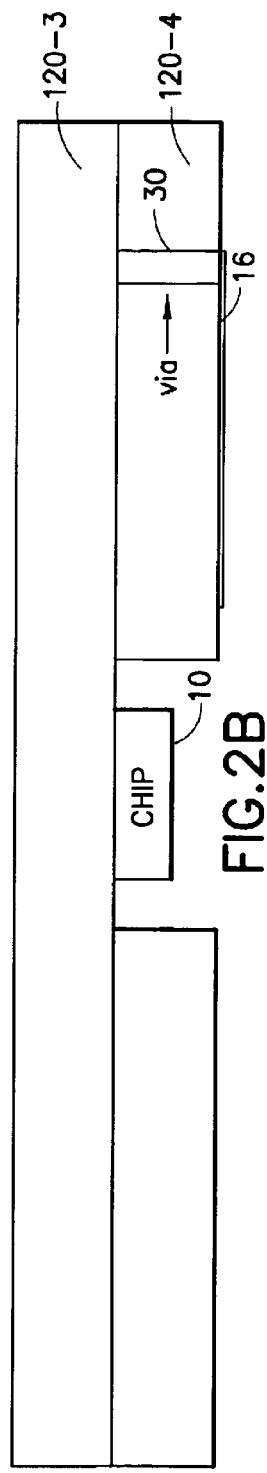

PLATING TAIL DESIGN FOR IC PACKAGES

TECHNICAL FIELD

The field of the invention is that of packaging integrated circuits ("IC"s), in particular substrates for supporting ICs.

BACKGROUND OF THE INVENTION

In the field of packaging ICs, including supporting ICs on printed circuit boards and other substrates, the standard method of forming interconnecting members, referred to as signal traces, includes a step of electroplating a conductor, such as gold. The electroplating process requires a conductive path between the trace receiving the gold and a power supply.

The standard physical construction is the fabrication of a conductive path attached to the signal trace at some convenient location and extending through or along the surface of the substrate to a suitable connection point. The conductive path is referred to as a plating tail. In high-frequency (high-speed) circuits, there can be a significant problem resulting from plating tails, in that the signal can reflect off the end of the tail or a step in the tail and then interfere with an IC, e.g. by canceling the desired signal.

A common solution to this problem is to remove all or most of the tail, e.g. by etching selected areas on the substrate. Such a selective etching process requires that the areas be defined by a mask that protects the areas that are not to be etched, and imposes an additional cost on the product, even if there are no other problems.

It would be advantageous to eliminate the need to define selected areas and then etch them.

SUMMARY OF THE INVENTION

The invention relates to a substrate for supporting ICs that leaves plating tails in place, but structures them so they do not interfere with signals being processed.

A feature of the invention is the connection of a conductive via to a signal trace, the via being connected to a plating tail that has a characteristic impedance such that the tail does not interfere with the signals.

A feature of the invention is the modification of a ground plane to alter the impedance of a plating tail.

Another feature of the invention is the alteration of a transverse dimension of a plating tail to alter its characteristic impedance.

Yet another feature of the invention is the limitation of the length of the vias to an amount that reduces the reflected amplitude.

Yet another feature of the invention is the grouping of plating tails in a location where they can be removed by a non-critical process.

BRIEF DESCRIPTION OF THE DRAWINGS

FIGS. 2A and 2B show an alternative embodiment of the invention.

DETAILED DESCRIPTION

Figure 1:
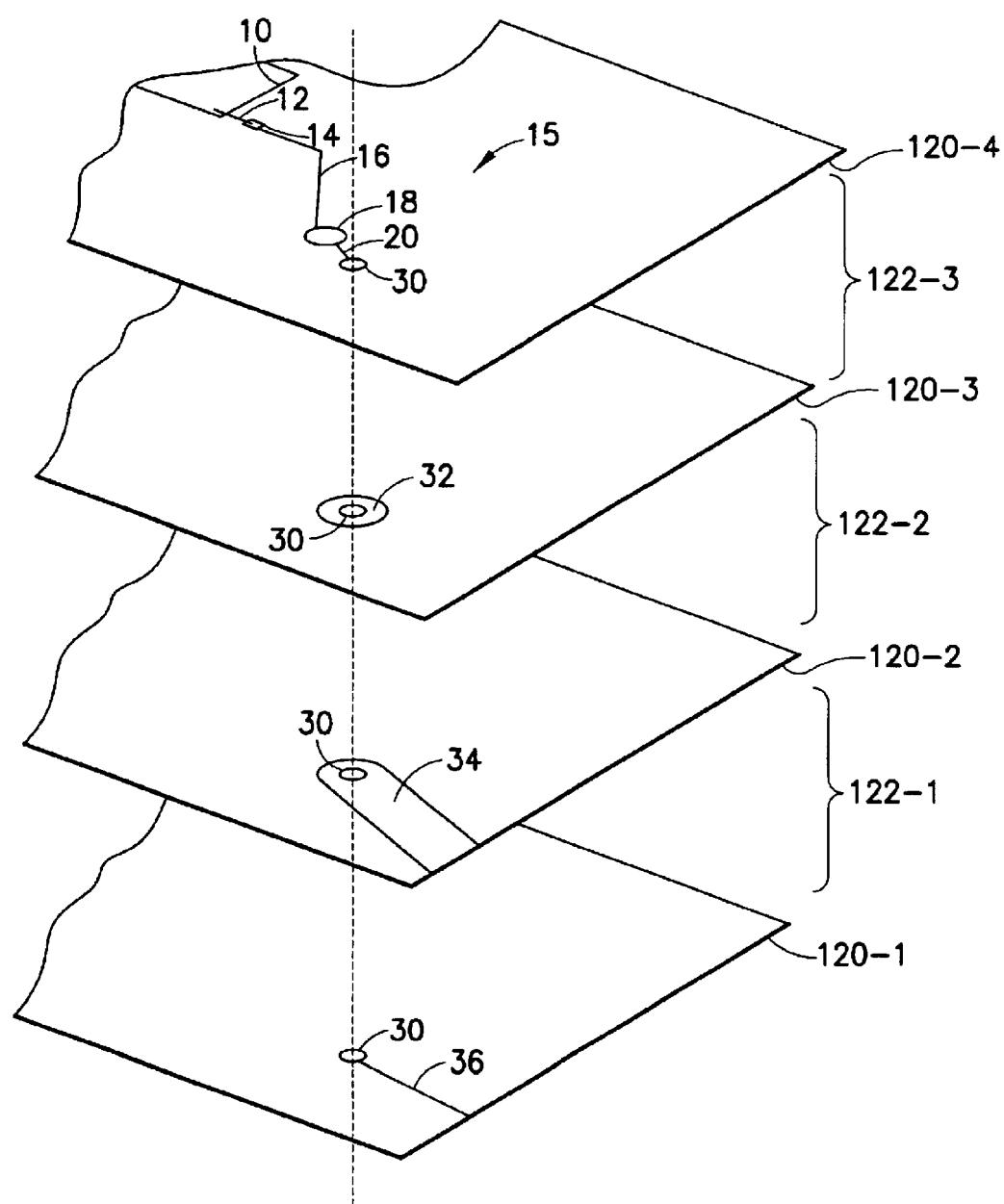
FIG. 1 shows, in partially pictorial, partially schematic form, an exploded view of an embodiment of the invention.

In FIG. 1, an IC 10 at the top of the Figure, is connected by wire bond 12 to wirebond pad 14 that, in turn, is connected to conductive line 16 on the surface 120-4 of a substrate. Contact pad 18, at the end of the signal trace collectively denoted with numeral 15 and comprising elements 12, 14, 16 and 18 attaches to an external contact that carries the signal in question off the substrate.

A plating connection sets up a conductive path during the plating process between signal trace 15 and a power supply. The plating connection comprises a stub 20, connecting pad 18 to conductive via 30 that extends vertically down and away from surface 120-4 through other surfaces. An example of other surfaces that are part of the substrate include a ground plane 120-3, a second ground plane 120-2 and a bottom surface 120-1.

At the bottom of the figure, rectangle 120-1 represents the bottom surface of the substrate, to which is attached the end of via 30 and plating tail 36. Those skilled in the art will be aware that plating tail 36 will have a tail characteristic impedance at the operating frequency of the signals carried by trace 15 that is determined by the cross section of tail 36, and the thickness 122-1 of the dielectric between tail 36 and the adjacent ground plane 120-2 (plus the dielectric constant, horizontal distance to other conductors, etc.). The standard impedance used in the industry is 50 ohms, though other values could be used.

According to the invention, the impedance of tail 36 is changed from the impedance used elsewhere in the apparatus, (for example 50 ohms) to a value that is sufficiently different that the signal will be reflected as though it were an open circuit (i.e. the portion of the signal that travels down via 30 will be reflected back with the same polarity and a reduced amplitude). The impedance of the plating tail does not have to be infinite, of course. An impedance of 100 ohms (compared to a nominal trace impedance of 50 ohms) will be sufficient for practical purposes. The magnitude of impedance difference that will be satisfactory depends on the magnitude of the reflected signal and also on the sensitivity of the next IC in the system. Since the electrical path length of the plating tail is reduced to the length of via 30 and since that length is only a millimeter or so (characteristic of substrate thickness in contemporary practice), the amplitude is reduced considerably. A rule of thumb is that a distance of about $1/10$ wavelength will reflect signals with an amplitude that can be ignored; i.e. the amplitude of the reflected signal is below a "reflection threshold" that would adversely affect the circuit and can be ignored. The thickness of via 30 will be in that range for most ICs of current interest. The effect of reflecting at an open circuit instead of at a short is that the reflection is positive, so that the reflection does not tend to cancel the signal.

Referring back to FIG. 1, the mechanism used to accomplish the desired impedance change is that ground plane 120-2 has a "voided area" 34, meaning that the conductive sheet in that area is removed. The conductive sheet in the remainder of the ground plane is available to set the impedance for other interconnections positioned above plane 120-2 or below it (i.e. elsewhere on surface 120-1). Ground plane 120-2 is spaced from surface 120-1 by distance 122-1, which is set such that other traces on surface 120-1 have the nominal impedance that is designed. Alternatively, the transverse dimensions of tail 36 could be set to differ from the trace characteristic impedance by increasing the width substantially from the standard trace width.

For purposes of illustration, a second conductive plane 120-3, which may be a ground plane or may be a plane carrying signal traces has a clearance space 32 separating via 30 from any conductor in that plane, so that undesired reflections (or short circuits) do not come from the conductor and affect signals on trace 15. The view in FIG. 1 is simplified for purposes of illustration. There may be other ICs in view and there may be other layers, conductive or dielectric in the substrate.

The operating frequency referred to above will, as is apparent to those skilled in the art, be the fundamental frequency of the Fourier decomposition of the signal. In addition, the harmonics of the fundamental frequency of the Fourier decomposition are to be included in the analysis of circuit performance.

Referring now to FIG. 2, there is shown an alternative embodiment, in which plating tail 36 is removed. In this embodiment, the substrate has only a single layer, seen in cross section in FIG. 2B. Signal trace 16 extends along the bottom of layer 120-4 to via 30. Plating tail 36 would have been at the interface between layers 120-4 and 120-3, but was removed before the two layers were bonded. The location of plating tail 36 is shown as a dotted line in top view 2A, showing the same chip 10, wire bond 12, bond pad 14 and trace 16 and contact pad 18.

In his case, the end of via 30 is a true open circuit. Preferably, the substrate is laid out so that plating tails are grouped together in areas that do not contain signal-carrying conductors. This feature is not essential, but is convenient, because the mask defining the etching are is then non-critical. Alignment of the mask can be very loose if no signal traces to be protected are in the vicinity. The surface carrying the plating tails can have groups of them located at various positions, so long as there is a clear separation between the blocks that can be etched (referred to as a "block etch") with a mask region that covers a number of plating tails, rather than having a mask opening for each plating tail to be removed. A mechanical process, such as grinding or scraping could also be used if the manufacturer prefers.

While the invention has been described in terms of a single preferred embodiment, those skilled in the art will recognize that the invention can be practiced in various versions within the spirit and scope of the following claims.

What is claimed is:

1. A substrate for supporting and connecting a set of at least one ICs comprises a set of signal traces connected to said set of ICs, at least one of said set of signal traces having a trace characteristic impedance at an operating frequency and a plating tail connected thereto, in which said plating tail has a tail characteristic impedance at said operating frequency that is substantially different from said trace characteristic impedance, whereby reflections from said plating tail during operation are reduced below a reflection threshold, said substrate further comprising a first surface supporting said signal trace and a second surface supporting said plating tail, said second surface being displaced vertically from said first surface.

2. A substrate for supporting and connecting a set of at least one ICs comprises a set of signal traces connected to said set of ICs, at least one of said set of signal traces having a trace characteristic impedance at an operating frequency and a plating tail connected thereto, in which said plating tail has a tail characteristic impedance at said operating frequency that is substantially different from said trace characteristic impedance, whereby reflections from said plating tail during operation are reduced below a reflection threshold, said substrate further comprising a conductive via extending downwardly from a first surface supporting said signal trace to a second surface supporting said plating tail, said second surface being displaced vertically from said first surface.

3. A substrate according to claim 2, said substrate further comprising a conductive sheet of conductive material disposed between said first surface and said second surface, said conductive sheet having a voided area disposed above said plating tail, said voided area having said conductive material removed therefrom, whereby said plating tail has said tail characteristic impedance.

4. A substrate according to claim 2, in which said plating tail has at least one transverse dimension such that said plating tail has said tail characteristic impedance.

5. A substrate according to claim 2, in which said via has a length less than $1/10$ of the wavelength of a signal at said operating frequency.

6. A substrate for supporting and connecting a set of at least one ICs comprises a set of signal traces connected to said set of ICs and disposed on a first surface of said substrate, at least two of said set of signal traces having a trace characteristic impedance at an operating frequency and a vertical conductive via connected thereto and extending to a second surface of said substrate opposite said first surface, said second surface being an insulating surface in which said at least two vias are grouped in at least one group on said second surface containing no signal traces, wherein a plating tail is connected to the vertical conductive via at vertical level that is vertically displaced from said first surface, wherein said plating tail has a tail characteristic impedance at said operating frequency that is substantially different from said trace characteristic impedance, whereby reflections from said plating tail during operation are reduced below a reflection threshold.

7. A substrate according to claim 6, in which said vias in said at least one group have a length less than $1/10$ or the wavelength of a signal at said operating frequency.

8. A substrate according to claim 6, in which said at least two vias are grouped in at least two groups.

9. A substrate according to claim 3, in which the voided area insulatively separates the conductive via from the conductive mated at of the conductive sheet.

10. A substrate according to claim 2, in which an electrical path length of the plating tail does not exceed a length of the via.

11. A substrate according to claim 2, in which the tail characteristic impedance is at least twice the trace characteristic impedance.

12. A substrate according to claim 2, in which a width of the plating tail substantially exceeds a width of the signal trace.

13. A substrate according to claim 1, said substrate further comprising a conductive sheet of conductive material disposed between said first surface and said second surface, said conductive sheet having a voided area disposed above said plating tail, said voided area having said conductive material removed therefrom, said voided area insulatively separating the conductive via from the conductive material of the conductive sheet.

14. A substrate according to claim 1, in which said plating tail has at least one transverse dimension such that said plating tail has said tail characteristic impedance.

15. A substrate according to claim 1, in which said via has a length less than $1/10$ of the wavelength of a signal at said operating frequency.

16. A substrate according to claim 1, in which the tail characteristic impedance is at least twice the trace characteristic impedance.

17. A substrate according to claim 1, in which a width of the plating tail substantially exceeds a width or the signal trace.

18. A substrate according to claim 6, said substrate further comprising a conductive sheet of conductive material disposed between said first surface and said vertical level, said conductive sheet having a voided area disposed above said plating tail, said voided area having said conductive material removed therefrom, said voided area insulatively separating the conductive via from the conductive material of the conductive sheet.

19. A substrate according to claim 6, in which the tail characteristic impedance is at least twice the trace characteristic impedance.

20. A substrate according to claim 6, in which a width of the plating tail substantially exceeds a width of the signal trace.

* * * * *